(12) United States Patent
U'Ren et al.

(10) Patent No.: US 7,423,287 B1
(45) Date of Patent: Sep. 9, 2008

(54) SYSTEM AND METHOD FOR MEASURING RESIDUAL STRESS

(75) Inventors: Gregory U'Ren, Berkeley, CA (US); Olivier Pierron, Sunnyvale, CA (US)

(73) Assignee: Qualcomm Mems Technologies, Inc., San Diego, CA (US)

( * ) Notice: Subject to any disclaimer, the term of this patent is extended or adjusted under 35 U.S.C. 154(b) by 0 days.

(21) Appl. No.: 11/690,708

(22) Filed: Mar. 23, 2007

(51) Int. Cl.
*H01L 23/58* (2006.01)
*H01L 21/66* (2006.01)
*G01R 31/28* (2006.01)

(52) U.S. Cl. ............................... 257/48; 438/18; 29/593
(58) Field of Classification Search ................... 257/48; 438/18; 29/593
See application file for complete search history.

(56) References Cited

U.S. PATENT DOCUMENTS

| | | | |
|---|---|---|---|
| 6,040,937 A | 3/2000 | Miles | |
| 6,077,452 A | 6/2000 | Litvak | |
| 6,285,207 B1 | 9/2001 | Listwan | |
| 6,567,715 B1 * | 5/2003 | Sinclair et al. | 700/110 |
| 6,657,218 B2 | 12/2003 | Noda | |
| 6,674,090 B1 | 1/2004 | Chua et al. | |
| 7,123,216 B1 | 10/2006 | Miles | |
| 2004/0042000 A1 | 3/2004 | Mehrl et al. | |
| 2005/0042777 A1 | 2/2005 | Boger et al. | |
| 2006/0066935 A1 | 3/2006 | Cummings et al. | |
| 2007/0201038 A1 | 8/2007 | Cummings et al. | |

FOREIGN PATENT DOCUMENTS

WO    WO 02/093116 A1    11/2002

OTHER PUBLICATIONS

Conner, "Hybrid Color Display Using Optical Interference Filter Array," SID Digest, pp. 577-580 (1993).
van Drieenhuizen, et al., "Comparison of Techniques for measuring Both Compressive and Tensile Stress in Thin Films." Sensors and Actuators, vol. 37-38, pp. 759-765. (1993).
Guckel et al., "Fine-Grained Polysilicon Films with Built-In Tensile Strain," IEEE Transactions on Electron Devices, vol. 35, No. 6, pp. 801-802, (1988).
Jerman et al., "A Miniature Fabry-Perot Interferometer with a Corrugated Silicon Diaphragm Support," IEEE Electron Devices Society (1988).

(Continued)

*Primary Examiner*—Evan Pert
(74) *Attorney, Agent, or Firm*—Knobbe Martens Olson & Bear LLP

(57) ABSTRACT

The invention comprises devices and methods for determining residual stress in MEMS devices such as interferometric modulators. In one example, a device measuring residual stress of a deposited conduct material includes a material used to form a MEMS device, and a plurality of disconnectable electrical paths, wherein said plurality of paths are configured to disconnect as a function of residual stress of the material. In another example, a method of measuring residual stress of a conductive deposited material includes monitoring a plurality of signals, each of said plurality of signals being associated with one of a plurality of test structures, said plurality of test structures each being configured to change the associated signal upon being subject to a predetermined amount of residual stress, sensing a change in said plurality of signals, and determining a residual stress level in said material based on the sensed change in the plurality of signals.

45 Claims, 14 Drawing Sheets

OTHER PUBLICATIONS

Lin et al., "A Micro Strain Gauge with Mechanical Amplifier," J. of Microelectromechanical Systems, vol. 6, No. 4, (1997).

Miles, "MEMS-based interferometric modulator for display applications," Proc. SPIE vol. 3876, pp. 20-28, Sep. 1999.

Miles, "5.3: Digital Paper™: Reflective Displays Using Interferometric Modulation," SID 00 Digest, pp. 32-35 (2000).

Miles, 10.1: Digital PaperTM for Reflective Displays, SID 02 Digest, pp. 115-117 (2002).

Miles et al., "Digital Paper™ for Reflective Displays," J. of the Society for Information Display Soc. Inf. Display USA. vol. 11, No. 1, p. 209-215. (2003).

Raley et al., "A Fabry-Perot Microinterferometer for Visible Wavelengths," IEEE Solid-State Sensor and Actuator Workshop, Hilton Head, SC (1992).

Singh et al., "Strain Studies in LPCVD Polysilicon for Surface Micromachined Devices," Sensors and Actuators, vol. 77, pp. 133-138, (1999).

Srikar et al., "A Critical Review of Microscale Mechanical Testing Methods Used in the Design of Microelectromechanical Systems," Society for Experimental mechanics, vol. 43, No. 3, (2003).

Zhang, et al., "Measurements of Residual Stresses in Thin Films Using Micro-Rotating-Structures." Thin Solid Films, vol. 335, pp. 97-105, (1998).

\* cited by examiner

|  | Column Output Signals | |
|---|---|---|
|  | $+V_{bias}$ | $-V_{bias}$ |
| Row Output Signals  0 | Stable | Stable |
| $+\Delta V$ | Relax | Actuate |
| $-\Delta V$ | Actuate | Relax |

SYSTEM AND METHOD FOR MEASURING RESIDUAL STRESS

BACKGROUND

1. Field of the Invention

The field of the invention relates to microelectromechanical systems (MEMS).

2. Description of the Related Technology

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. An interferometric modulator may comprise a pair of conductive plates, one or both of which may be transparent and/or reflective in whole or part and capable of relative motion upon application of an appropriate electrical signal. One plate may comprise a stationary layer deposited on a substrate, the other plate may comprise a metallic membrane separated from the stationary layer by an air gap. Particular fabrication materials and processes typically cause at least some level of residual stress in the materials that form an interferometric modulator, and if sufficiently high, residual stress can be detrimental to the interferometric modulator's performance. Sensing high levels of residual stress would be beneficial in the art to optimize interferometric modulator fabrication techniques and increase their reliability. Such devices have a wide range of applications, and it would also be beneficial in the art to utilize and/or modify the characteristics of these types of devices so that their features can be exploited in improving existing products and creating new products that have not yet been developed.

SUMMARY OF CERTAIN EMBODIMENTS

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other stress measuring devices.

In one embodiment, a device for measuring residual stress of a deposited conductive material, includes a material used to form a MEMS device, and a plurality of disconnectable electrical paths, wherein said plurality of paths are configured to disconnect as a function of residual stress of the material. The plurality of paths are configured to disconnect at different predetermined levels of residual stress over a range of residual stress. The range of residual stress can span a residual stress level of about 300 Mpa. In some examples, the range of residual stress comprises at least about 225 Mpa-375 Mpa. In further examples, the range of residual stress is centered on a selected residual stress level and includes a range of at least about 75 Mpa around said selected residual stress level. In some examples, the range of residual stress is centered on a selected residual stress level and includes a range of at least about 25 Mpa around said selected residual stress level. Each of said plurality of paths can be defined by a dimensional attribute which is one of a plurality of predetermined different dimensional attributes, each dimensional attribute being associated with one of a plurality of predetermined residual stress levels within a range of residual stress levels such that each of said plurality of paths disconnects when subjected to the residual stress level associated with its dimensional attribute. In various embodiments, the dimensional attribute can include width, depth, or a cross-sectional area. The device can include a plurality of first contacts configured to interface with a sensing system, where each of said plurality of first contacts is connected to one of said plurality of paths at a first end of the path, and a plurality of second contacts configured to interface with the sensing system, wherein each of said plurality of second contacts is connected to one of said plurality of paths at a second end of the path. The first contact can be configured to interface with a sensing system, wherein said first contact is connected to a first end of all said plurality of paths, and a second contact can be configured to interface with the sensing system, wherein said second contact is connected to a second end of all of said plurality of paths. The device of claim 1 can further include a display, a processor that is configured to communicate with said display, said processor being configured to process image data, and a memory device that is configured to communicate with said processor. The device can also include a driver circuit configured to send at least one signal to the display. The device can include a controller configured to send at least a portion of the image data to the driver circuit. The device can also include an image source module configured to send said image data to said processor, and the image source module can include at least one of a receiver, transceiver, and transmitter. In some embodiments, the device includes an input device configured to receive input data and to communicate said input data to said processor. In some examples, at least five or more of said plurality of paths are configured to fracture at different predetermined amounts of residual stress over the range of residual stress. The plurality of paths are aligned in the same direction, or a first portion of the plurality of paths can be aligned in a first direction and a second portion of the plurality of paths are aligned in a second direction. In some configurations, the first direction and the second direction are about normal to each other. In some embodiments, a third portion of said plurality of paths are aligned in a third direction. The disconnectable paths can be fabricated out of any type of conductive material and are typically fabricated out of the same material as he movable reflective layer. e.g., Nickel.

In another embodiment, a test unit for measuring residual stress includes means for forming a MEMS device and means for indicating the residual stress of said forming means.

In another embodiment, a device for measuring residual stress includes a plurality of test structures formed from a portion of a conductive material, each test structure including a first electrical contact configured to interface with a sensing system, a second electrical contact configured to interface with a sensing system, a first base section connected to said first electrical contact, a second base section connected to said second electrical contact, and a free-standing center section connected between said first base section and said second base section, said center section having a dimensional attribute associated with a predetermined residual stress level such that said center section is configured to fracture and form an electrical disconnect between said first base section and said second base section when said center section is subject to said predetermined residual stress level, where the plurality of test structures have center sections with varying dimensional attributes that are configured to fracture when subjected to corresponding varying residual stress levels over a predetermined range of residual stress such that a residual stress level of the material is indicated by the test structure having a fractured center section with a dimensional attribute that is associated with the highest residual stress level.

In another embodiment, a method of measuring residual stress of a conductive deposited material includes monitoring a plurality of signals, each of said plurality of signals being associated with one of a plurality of disconnectable paths, said plurality of disconnectable paths each being configured to change the associated signal upon being subject to a predetermined amount of residual stress, sensing a change in said plurality of signals, and determining a residual stress level in said material based on the sensed change in the plurality of signals.

In another embodiment, a system for measuring residual stress includes a device on a substrate comprising a plurality of test structures formed from a portion of said thin film, each test structure including a first electrical contact configured to interface with a sensing system, a second electrical contact configured to interface with a sensing system, a first base section connected to said first electrical contact, a second base section connected to said second electrical contact, a freestanding center section connected between said first base section and said second base section, said center section having a dimensional attribute associated with a predetermined residual stress level such that said center section is configured to fracture and form an electrical disconnect between said first base section and said second base section when said center section is subject to said predetermined residual stress level, where said plurality of test structures have center sections with varying dimensional attributes that are configured to fracture when subjected to corresponding varying residual stress levels over a predetermined range of residual stress such that a residual stress level of said material is indicated by the test structure having a fractured center section with a dimensional attribute that is associated with the highest residual stress level; and a test circuit connectable to said first contact and said second contact of each of the plurality of test structures, said test circuit configured to determine if the center section portion of each test structure is in an intact state or a fractured state, and determine a residual stress level of the material based on the determined states.

Another embodiment includes a method of manufacturing a device to indicate the residual stress in a deposited material, the method including disposing a conductive reflective membrane on a substrate such that a plurality of substantially parallel freestanding disconnectable test structures having different widths are formed adjacent to one another, forming from a first end of each of said plurality of test structures an electrical path connected to a first contact, and forming from a second end of said plurality of test structures an electrical path connected to a second contact, said first and second contacts allowing interface with a sensing system.

DETAILED DESCRIPTION OF CERTAIN EMBODIMENTS

Figure 1:
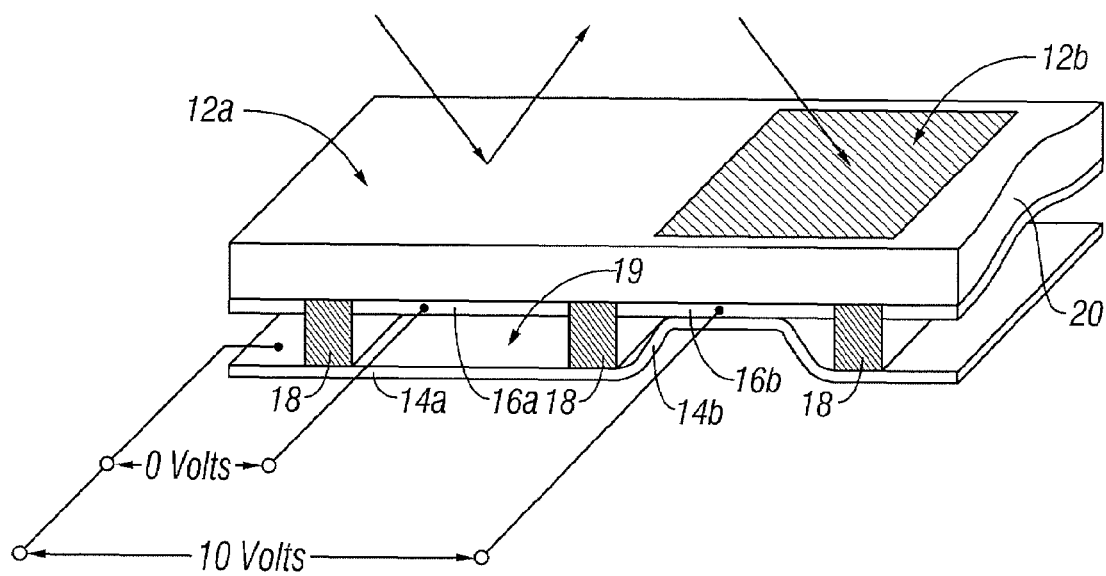
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

The presence of residual stresses in a MEMS device interferometric modulator affects its performance and reliability. For example, variations in residual stresses in a MEMS display comprising interferometric modulators can result in unacceptable variations in color throughout the display. Because variation in residual stress in a MEMS display may indicate a manufacturing or fabrication problem, monitoring the residual stress level(s) during fabrication allows early identification and correction of such problems. In some embodiments, a residual stress monitoring device measures residual stress on a wafer containing the MEMS device, and variations of residual stress can be monitored across the surface area of the wafer, from wafer to wafer, and/or from lot to lot. The residual stress monitoring device (sometimes referred to herein as a "residual stress monitor" or "RSM") has at least one disconnectable path ("path") that breaks (or disconnects) when subject to a certain predetermined level of residual stress. The RSM can be monitored to determine whether the path is intact or broken, which indicates whether the certain residual stress level is present.

An RSM can include multiple paths that are configured to break at different levels of stress over a predetermined range of stress levels. Determining which paths are broken and which paths are intact indicates the maximum residual stress level present. The disconnectable path can be, for example, an optical path or an electrical path that is configured to conduct a signal (e.g., optical or electrical). The paths on a MEMS wafer can be an electrical circuit fabricated on the wafer during fabrication of the MEMS devises, and fabricated using the same material as the moveable reflective structure of the MEMS device so that it indicates a level of residual stress that affects the MEMS device. Each disconnectable path has a free-standing portion with a predetermined width which is associated with a particular residual stress level, and which disconnects (breaks) if the forces of residual stress rise above a certain level. For a plurality of electrical paths, the paths may be monitored by sensing the resistance of each path, which is finite when intact and infinite if broken. For a plurality of optical paths, light can be propagated through each path, and the light output of the paths can be used to indicate whether the path is intact (light) or broken (no light). The paths can be monitored to determine broken or intact paths, and this information can be used to determine the presence of a certain stress level because each path is associated with a predetermined amount of residual stress. The disconnectable paths can be aligned to indicate residual stress in a certain direction. In some exemplary RSMs, the paths are aligned in parallel. Other RSMs include a first set of paths aligned in one direction and a second set of paths aligned in a second direction. In other RSMs, the first and second direction are substantially perpendicular to each other, while in other embodiments the first and second direction arc at an angle between 0 degrees and 90 degrees to each other. Such RSMs can be formed on any area of the wafer. In some embodiments, a plurality of RSMs are configured at a plurality of locations on the wafer or substrate. RSMs are described herein below in reference to FIGS. 8-17, following a description of MEMS interferometric modulators.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
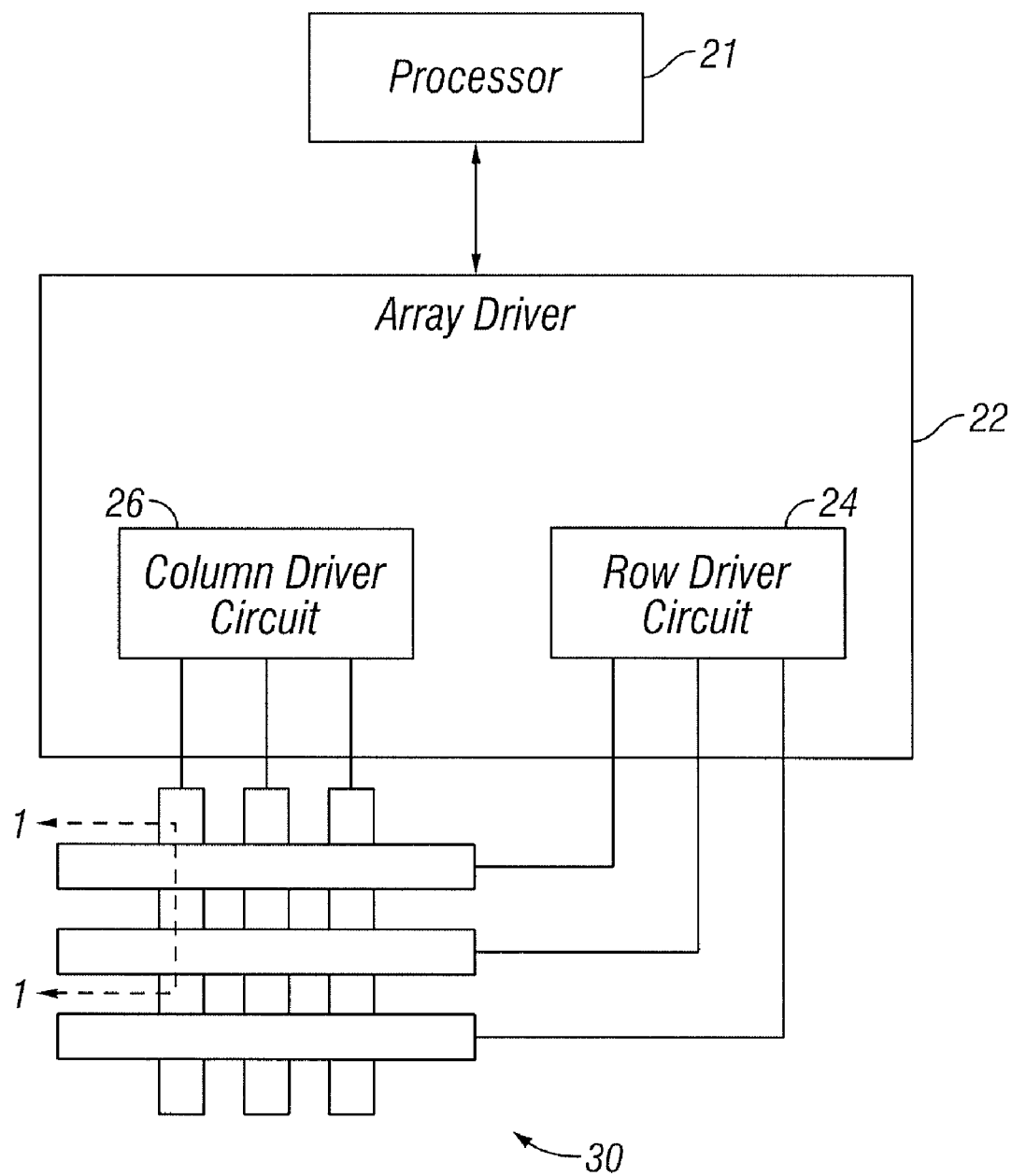
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
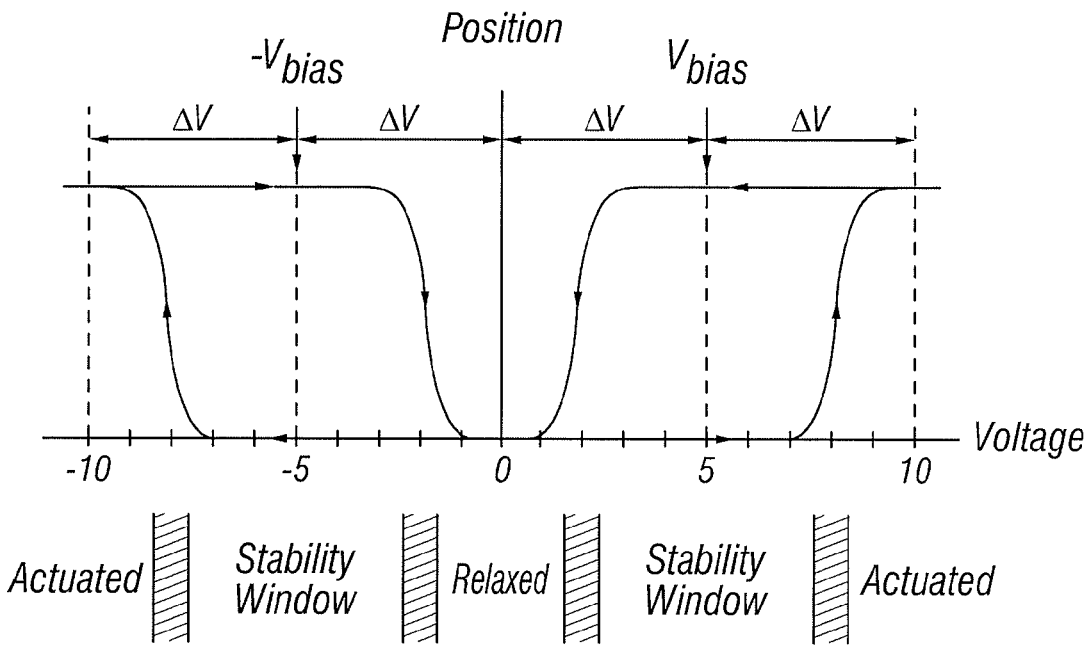
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
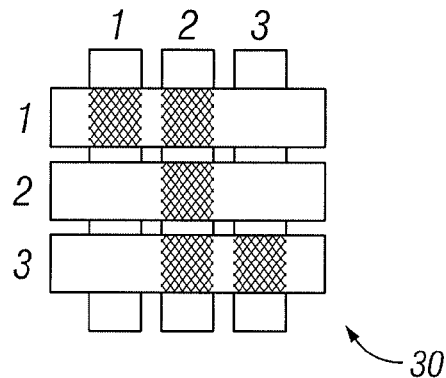
FIGS. 5A and 5B illustrate one exemplary timing diagram for row and column signals that may be used to write a frame of display data to the 3×3 interferometric modulator display of FIG. 2.
Figure 5B:
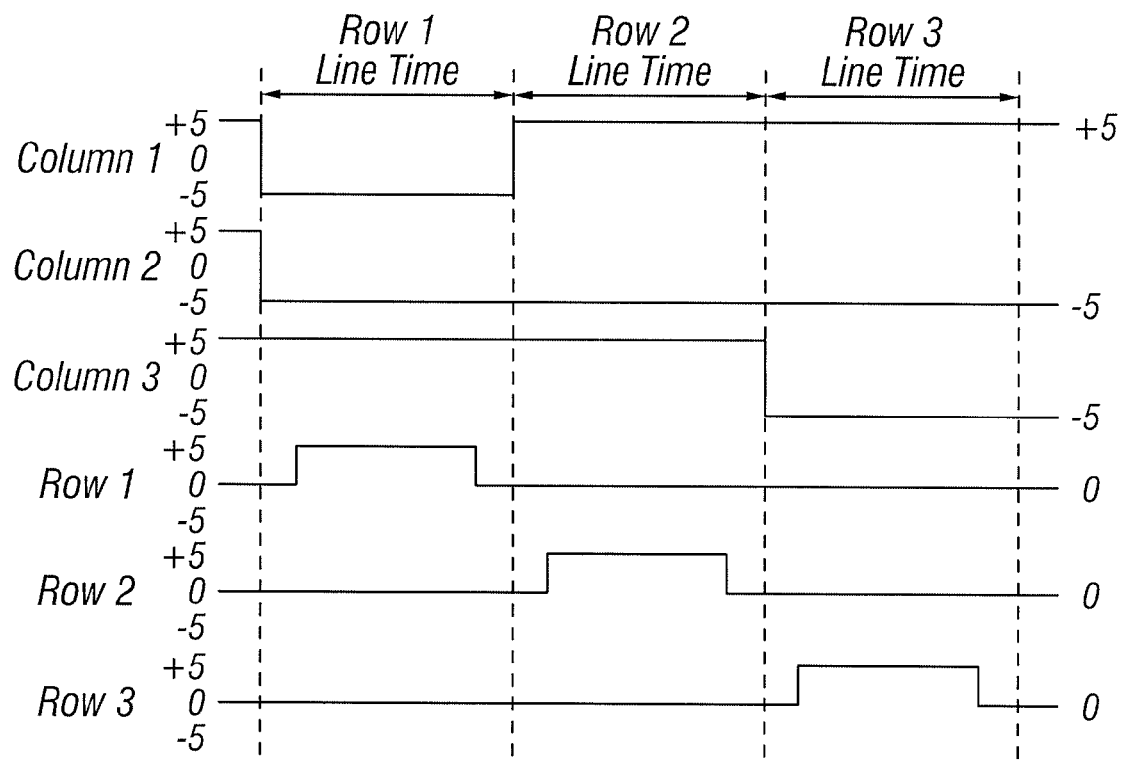

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
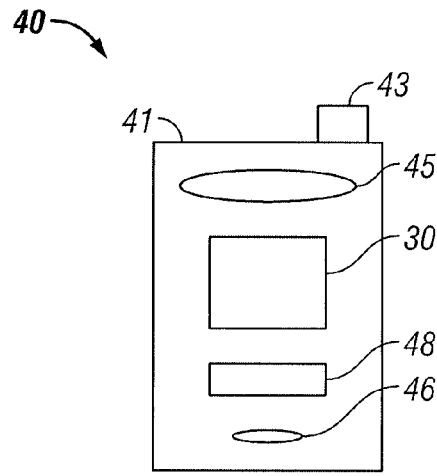
FIGS. 6A and 6B are system block diagrams illustrating an embodiment of a visual display device comprising a plurality of interferometric modulators.
Figure 6B:
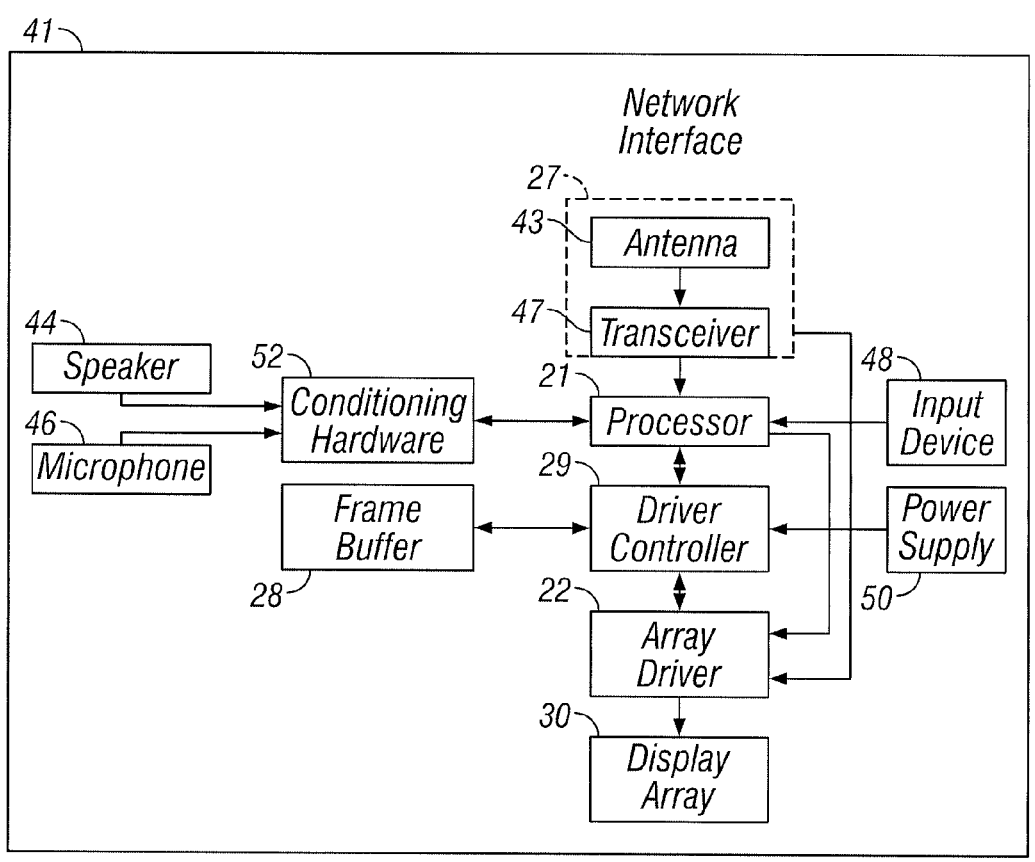

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
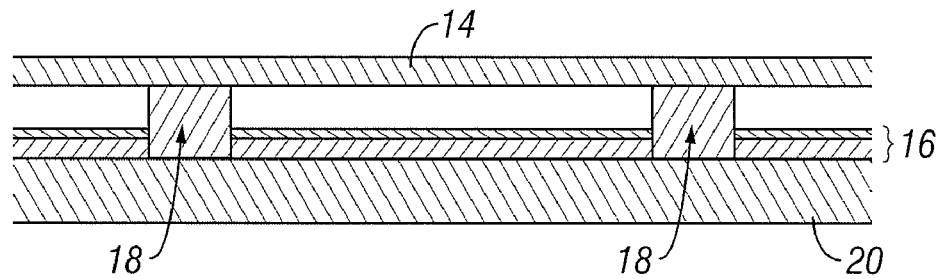
FIG. 7A is a cross section of the device of FIG. 1.
Figure 7B:
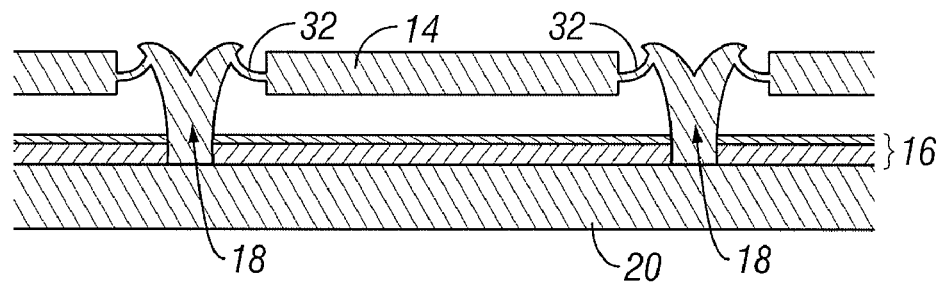
FIG. 7B is a cross section of an alternative embodiment of an interferometric modulator.
Figure 7C:
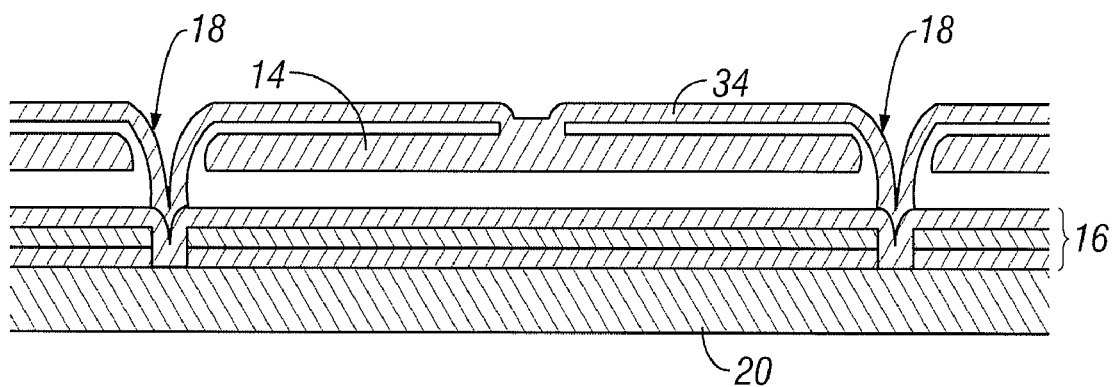
FIG. 7C is a cross section of another alternative embodiment of an interferometric modulator.
Figure 7D:
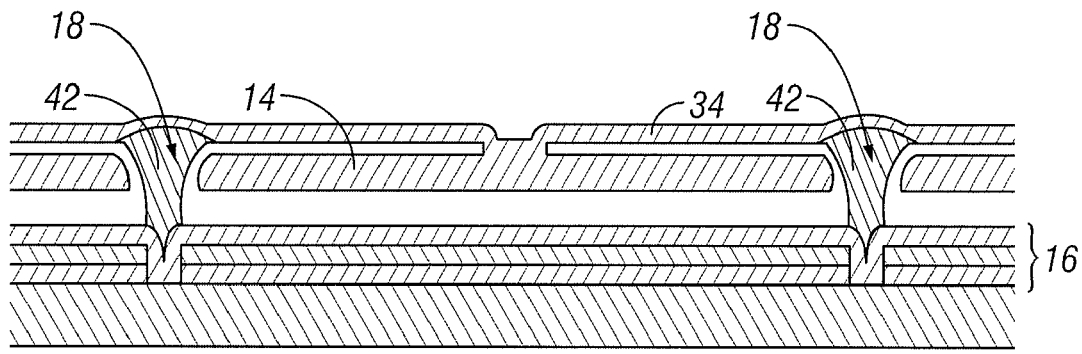
FIG. 7D is a cross section of yet another alternative embodiment of an interferometric modulator.
Figure 7E:
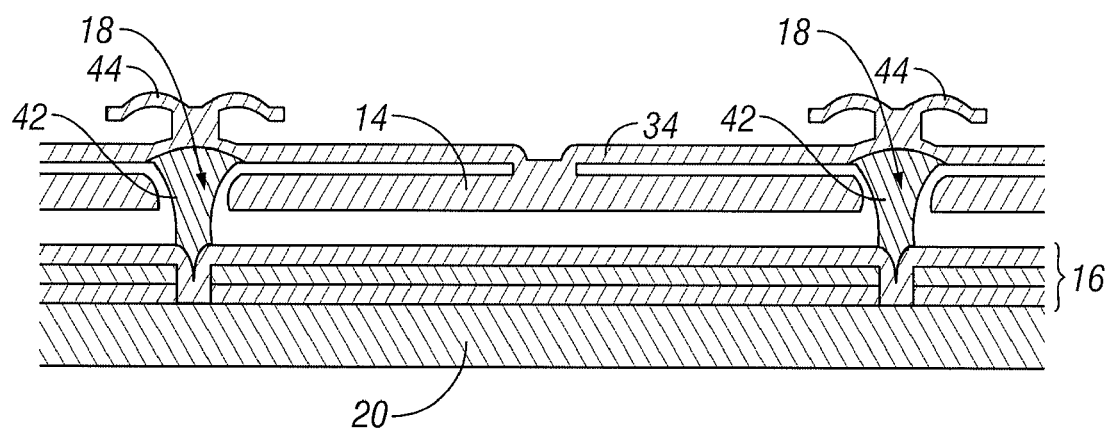
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

One property that can affect the performance and reliability of a MEMS interferometric modulator is residual stress. Residual stress can be introduced during manufacturing and may depend on the particular materials and/or processes used in fabrication of the MEMS device. In an interferometric modulator comprising a deformable portion or structure (e.g., a movable or deformable membrane) which has been mechanically released during the fabrication process, the residual stress determines, at least in part, the resulting geometry of the deformable portion, e.g., the amount of deformity of the movable membrane. Excessive residual stress in an interferometric modulator can affect deformation properties of its movable membrane, and correspondingly can affect its ability to interferometrically modulate light. Accordingly, controlling residual stress can be a factor in designing the interferometric modulator, in selection of the material used to make the interferometric modulator, and in designing or selecting a fabrication process to manufacture the interferometric modulator.

Because a deformity in a movable structure can indicate its residual stress, a measurement of the amount of deformity of a movable portion of an interferometric modulator can be used to determine its residual stress. A device for measuring the deformity of a structure and determining the corresponding residual stress indicated by such a deformity are described in further detail in the patent applications referenced below. In some embodiments, such interferometric modulators are not configured to have a movable portion (e.g., membrane) that is deformed by an actuation voltage, but instead the movable portion is deformed by the residual stress. In some embodiments, the movable portion is configured to be moved by an applied voltage to achieve a resonant state (but not an actuation state), and this movement is used to indicate residual stress. Some examples of such test structures are described in co-pending U.S. patent application Ser. Nos. 11/453,633, titled "System and Method for Providing Residual Stress Test Structures" filed Jun. 15, 2006, and 11/445,926, titled "Photonic MEMS and Structures" filed Jun. 1, 2006, both of which are assigned to the assignee hereof and are incorporated by reference herein in their entirety. FIGS. 8-17 illustrate other types of residual stress monitors that use a disconnectable electrical path to determine residual stress.

Figure 8:
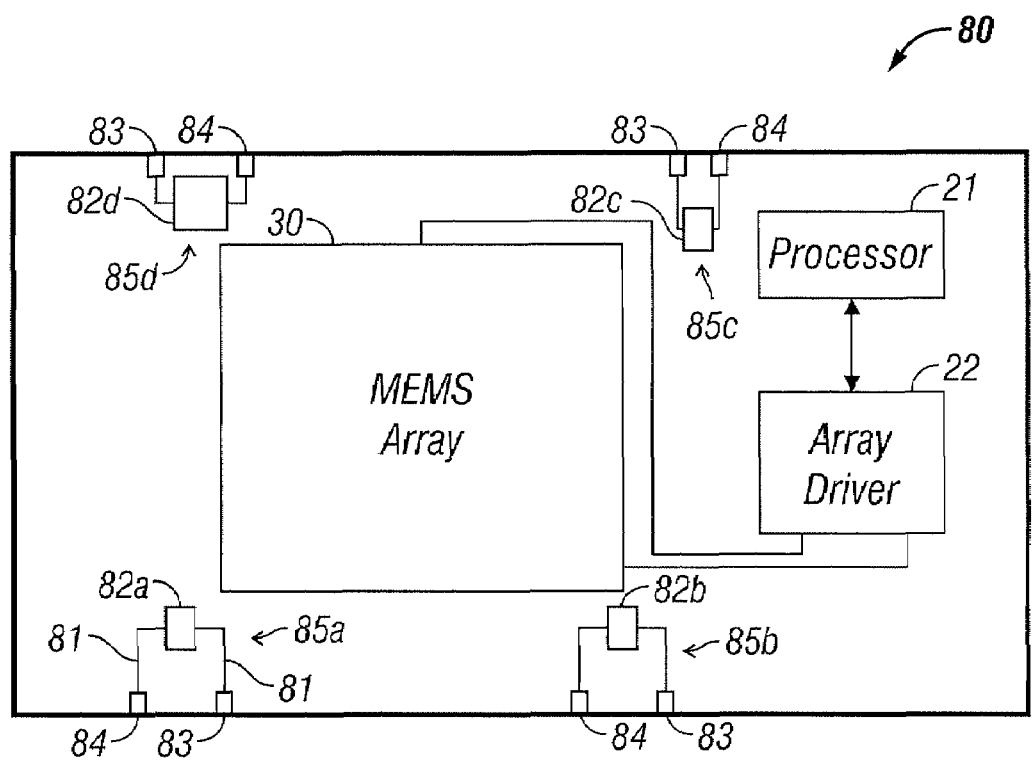
FIG. 8 is a block diagram illustrating a device for measuring residual stress disposed on a substrate with a MEMS array.

FIG. 8 is a block diagram illustrating an example of a display 80 that includes four residual stress monitors 85a-d ("RSM") disposed near each corner of a MEMS array 30. The MEMS array 30 can comprise interferometric modulators, as described above in reference to FIGS. 1-7E. Other examples of displays may only have one RSM, or may have any number of RSMs disposed at various locations relative to the array 30. In this example, the RSMs incorporate electrical circuits as the paths. In other embodiments optical configurations may also be used. The display 80 includes a MEMS array 30 that is driven by an array driver 22, which is in communication with a processor 21, as illustrated in an exemplary configuration in FIG. 2.

Each RSM 85a-d includes a device that can be monitored to determine residual stress in the material of which it is formed. For example, the RSM 85a includes a first electrical contact 83 and a second electrical contact 84 for interfacing electrically with a test circuit or system that senses the state (e.g., intact or broken) of the at least one disconnectable path in the RSM. The test system or test circuit can be incorporated on the display, or be a separate component. An example of such a system is described herein in reference to FIG. 16. Here, the first contact 83 and the second contact 84 are representative of one or more first contacts 83 and second contacts 84 of each RSM 85, where the number of contacts are determined by the particular configuration of the RSM, and are illustrated here as a single first contact 83 and a second single contact 84 for simplicity. Some exemplary configurations of RSMs include FIG. 9, which illustrates an example of an RSM with multiple first contacts 83 and multiple second contacts 84, and FIG. 13, which illustrates an example of an RSM having a single first contact 83 and a single second contact 84.

Each RSM 85 also includes at least one disconnectable path, a portion of which is illustrated by the electrical path 81 connecting the contacts 83, 84 to a disconnectable portion 82 of the disconnectable path. Further details of the disconnectable portions of the RSMs 85a-d are described in reference to FIGS. 9-13. The RSMs 85 are typically made during fabrication of the MEMS array 30 and formed from the same material such that stress indicated by the RSM is indicative of residual stress of the MEMS array 30.

Figure 9:
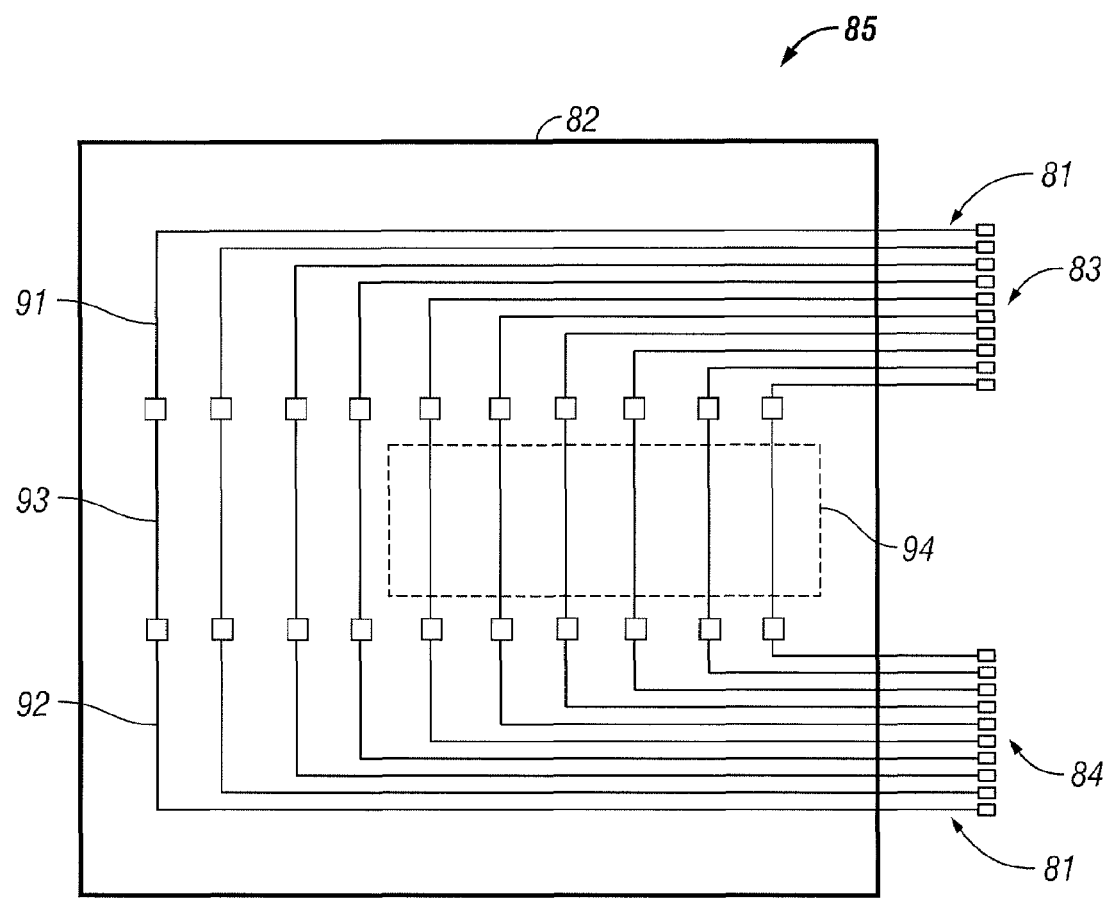
FIG. 9 is a schematic illustrating one embodiment of a device for measuring residual stress.

FIG. 9 is a schematic illustrating one embodiment of a RSM 85 such as illustrated in FIG. 8. The RSM 85 includes multiple first contacts 83 and multiple second contacts 84. Electrical paths 81 connect the first contacts 83 and second contacts 84 to the disconnectable portions 82 of the disconnectable paths. In this example, each of the disconnectable paths is a separate electrical path from a first contact 83 to a second contact 84 which is configured to break when subject to a predetermined fracture stress level, from which a residual stress level can be determined. Ten separate disconnectable electrical paths are illustrated in this example, however, more or less paths are also possible in different embodiments.

Figure 12:
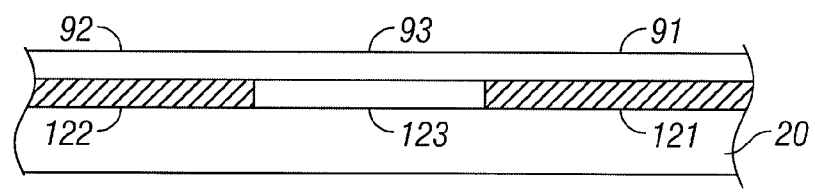
FIG. 12 is a side elevation view of a portion of a disconnectable path.

Each disconnectable path includes a first base portion 91 and a second base portion 92 which are connected to an underlying support material. Each path also includes a freestanding portion 93, sometimes referred to herein as a "center section," which is not connected to an underlying material. FIG. 12 further illustrates the freestanding aspect of the center section 93. Each center section 93, or a portion thereof, can be configured to have a particular dimensional attribute that is associated with a residual stress level, so that the center section 93 breaks when it is subject to its associated predetermined stress level.

For an RSM 85 as illustrated in FIG. 9 having multiple paths, the center section 93 in each path can be configured with a different dimensional attribute, such as width, depth, or cross-sectional area, which is associated with a different residual stress level. In some embodiments, two or more center sections 93 can be configured with the same dimensional attribute for redundancy.

In this case, when RSM 85 is subject to a particular residual stress level which is in the range of associated residual stress levels, one or more of the center sections 93 disconnect or break. Monitoring an electrical signal traveling through each of the paths via the first contacts 83 and second contacts 84 indicates which paths are broken. For example, a finite resistance value indicates the path is intact, an infinite reading indicates it is disconnected. Determination of the residual stress level present can then be made knowing the level of residual stress associated with each path and knowing which paths are broken. Dimensional attributes of a portion of the center sections 93, indicated by dashed box 94, are further illustrated in FIG. 10.

An advantage of this technique is that no visual inspection is necessary. Also, unlike some other devices for measuring residual stress, no electrostatic actuation is necessary (for example, when measuring residual stress using an interferometric modulator). The uniformity of residual stress across a plate can be easily monitored by using a plurality of RSMs. One or more RSMs can be positioned at any desirable location relative to the MEMS array 30. For an RSM designed to measure or indicate the residual stress of a movable mechanical layer, the RSM can comprise Nickel, or Aluminum, or any other material that is used to form the movable mechanical layer. If the RSM is designed to measure the residual stress of another component, the RSM can be formed using the same material that was used to form the component.

Figure 10:
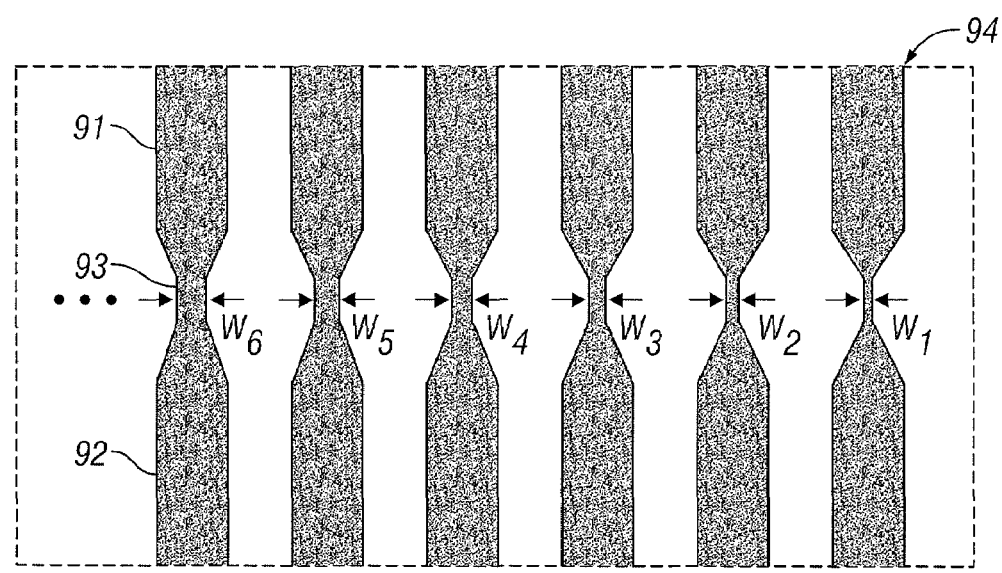
FIG. 10 is a schematic illustrating a portion of a plurality of disconnectable paths.
Figure 11:
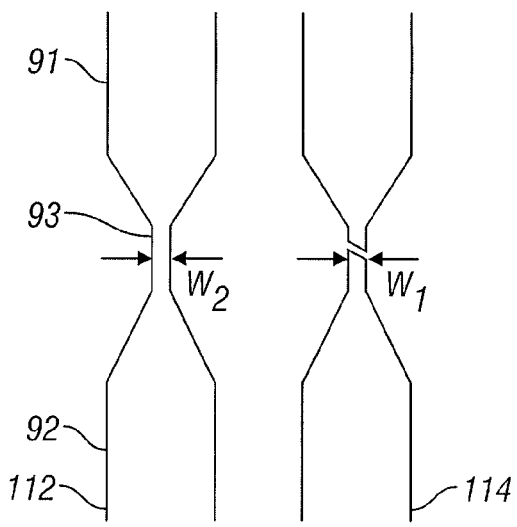
FIG. 11 is a schematic illustrating a portion of a plurality of disconnectable paths where one path is in an open state.

FIG. 10 illustrates a portion 94 of a plurality of disconnectable paths. In this example, each of the six center sections 93 includes a portion with a predetermined width of varying size, indicated by $W_1$-$W_6$, each of which is associated with a predetermined residual stress level. FIG. 11 further illustrates two of the center sections 112, 114 having widths of $W_2$ and $W_1$, respectively. In this example, path 114 is broken (or in an "open state") and path 112 is intact, indicating the presence of residual stress that exceeded the predetermined residual stress level associated with a center section having a width of $W_1$. The center sections 93 are designed with a portion narrower (e.g., of a predetermined dimensional attribute) than its ends. The applied stress in the narrow portion $Y_{max,i}$ is indicative of residual stress $\sigma_r$. Failure occurs when the applied stress $\sigma_{max,i}$ exceeds fracture stress $\sigma_f$, a material property, resulting in the path being broken, and in this case resulting in an electrical open. A simple resistance measurement can be made of each path using the first contacts 83 and second contacts 84 to detect broken paths. Once the applied stress $\sigma_{max,i}$ is known (e.g., by knowing what fracture stress $\sigma_f$ was exceeded, the corresponding residual stress $\sigma_r$ can be calculated. In one example, the residual stress $\sigma_r$ can be calculated by a first order approximation as illustrated by the following equation:

$$\sigma_r = (w_{min,i}/w_0) * \sigma_{max,i} \quad [1]$$

where is $w_0$ is width of the ends of the center section 93, and $w_{min,i}$ is the width of the narrow portion of the center section 93.

In one example, a RSM includes ten disconnectable paths with center sections of varying widths, the widths varying from $w_0$=50 um to $w_{10}$=4 um. For some fabrication techniques, the smallest width may be equal to the smallest width achievable by the fabrication technique. In one example, the desired residual stress level is about 300 Mpa, and the center sections are configured with dimensional attributes such that they break in the range of 225 Mpa-375 Mpa. Having more paths allows smaller increments of the dimensional attribute throughout the configured range.

FIG. 12 is a side elevation view of a portion of a disconnectable path. The first base section 91 connected to an underlying material 121, and the second base section 92 is also connected to an underlying material 122. The center section 93, however, is freestanding, e.g., the portion of the center section having a predetermined dimensional attribute associated with a residual stress level is not connected to an underlying material but instead is fabricated to span a cavity 123. This allows the center section 93 to be deformed by stress and fracture at a certain predetermined stress level. As one of skill in the art will appreciate, the free-standing center section can be fabricated by first disposing a sacrificial material (e.g., molybdenum) and then depositing a layer of another material, for example, the same material that is used to form the movable mechanical layer 14 (FIG. 1) (e.g., silicon, aluminum, nickel, or germanium, gold, chromium, silver, and alloys thereof) on the sacrificial layer. The fabrication process then removes the sacrificial material in an area to form cavity 123, etching away material under the center section 93 by accessing the material from a side of the structure, and releasing a free-standing center section 93. Accordingly, such a process can be used to manufacture a device to indicate the residual stress in a deposited material. In one example, the process includes disposing a conductive reflective membrane on a substrate such that a plurality of substantially parallel free-standing disconnectable test structures 93 having different widths are formed adjacent and aligned in substantially parallel to one another. Then, the process forms from a first end 91 of each of said plurality of test structures 93 an electrical path connected to first contact(s) 83 (FIG. 9), and forming from a second end 92 of said plurality of test structures 93 an electrical path connected to a second contact(s) 84 (FIG. 9), said first contact(s) 83 and second contact(s) 84 allowing interface with a sensing system, such as test circuit 162 illustrated in FIG. 16.

Figure 13:
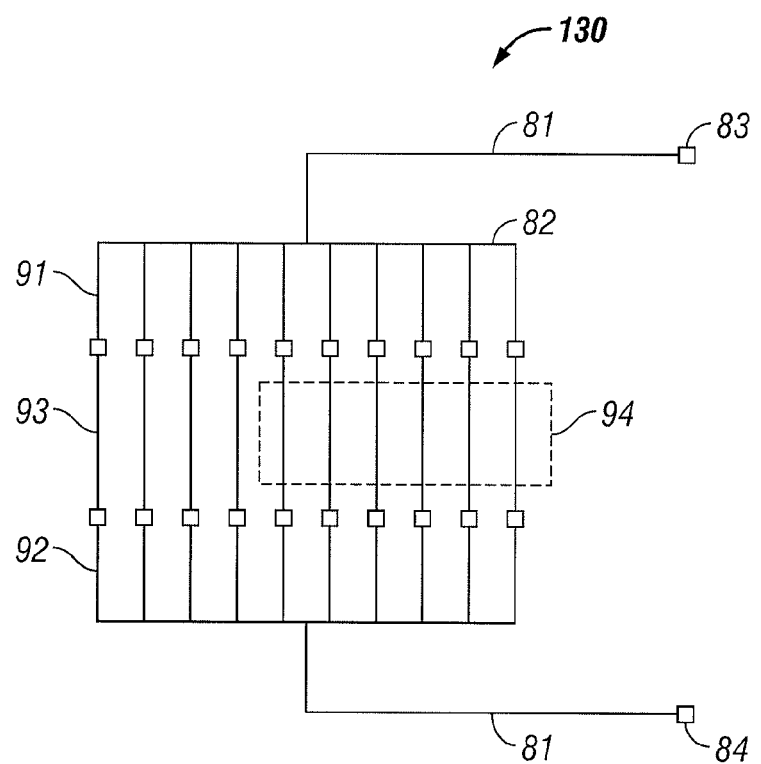
FIG. 13 is a schematic illustrating another embodiment of a device for measuring residual stress.

FIG. 13 is a schematic illustrating another embodiment of a RSM 130 for measuring residual stress. This RSM 130 comprises a first contact 83, a second contact 84 and paths 81 that connect the first and second contacts to a plurality of disconnectable center sections 82. In this embodiment, the paths 81 are single electrical paths, one electrical connecting the first contact 83 to one end of all of the first base sections 91, and the other electrical path connecting the second contact 84 one end of all the second base sections 92, so that the center sections 93 are in an electrically parallel configuration. When one or more of the paths are broken by stress, the resistance of the RSM 130 changes, as sensed by a test circuit (not shown) connected to the first contact 83 and the second contact 84. One advantage of this embodiment is that there are significantly less contacts 83, 84 needed, which also can simplify the interface with a test circuit that is connected to determine which of the electrical paths is intact or broken.

Figure 14:
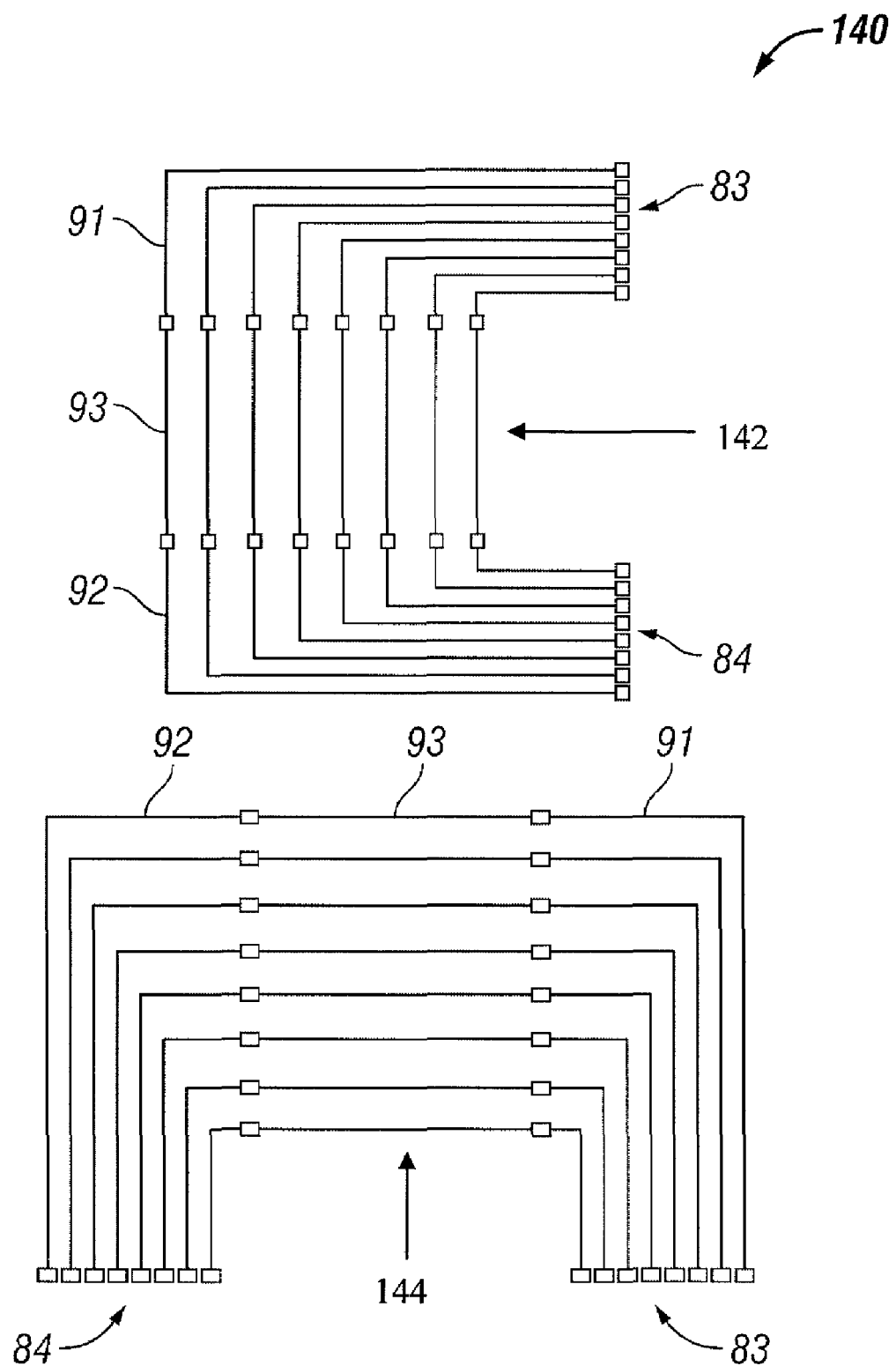
FIG. 14 is a is a schematic illustrating an embodiment of a device for measuring residual stress having two sets of disconnectable paths that are aligned substantially normal to each other for measuring residual stress in two different directions.

In the RSM 85 illustrated in FIG. 9, all of the center sections 93 of the ten disconnectable paths are aligned substantially parallel to measure a stress applied in a first direction. Other RSM embodiments can be configured to measure stress in two directions. For example, FIG. 14 illustrates an embodiment of a RSM 140 having a first set of disconnectable paths 142 and a second set of disconnectable paths 144 for measuring stress occurring in two different directions. In this example, the first set of paths 142 is aligned substantially perpendicular to the second set of paths 144. Other configurations of aligning the center sections 93 for measuring stress in at least two non-perpendicular directions are also contemplated. For example, RSMs can be configured with two sets of center sections 93 that are aligned at angles between zero (0) and ninety (90) degrees relative to each other.

Figure 15:
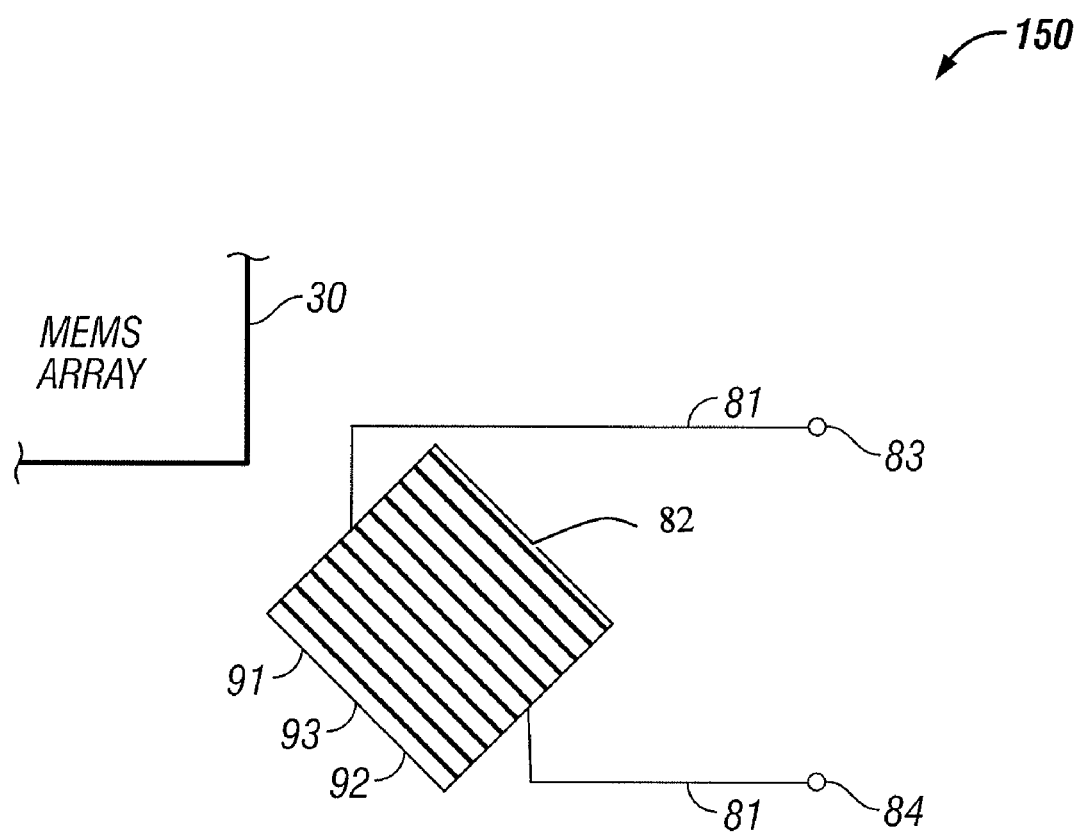
FIG. 15 is a schematic illustrating an embodiment of a device for measuring residual stress having more than two sets of disconnectable paths where each set is aligned in a different direction for measuring residual stress in more than two different directions.

FIG. 15 illustrates an example of an RSM 150 that is configured to measure the "average" residual stress in two different directions relative to the x-y orientation of a MEMS array 30. RSM 150 includes a set of disconnectable paths 82 having first base sections 91, second base sections 92, and free-standing center sections 93. The disconnectable paths 82 are connected to first contact 83 and second contact 84. The disconnectable paths 82 can be configured with separate disconnectable paths each connecting to its own first and second contact 83, 84, for example, as illustrated in FIG. 9, or it can be configured electrically parallel with a single first contact 83 and a single second contact 84, for example, as illustrated in FIG. 13. The disconnectable center sections 93 are aligned at an angle of 45° relative to the x-y orientation of the MEMS array 30. In such a configuration, residual stress occurring in the x-direction or the y-direction of the MEMS array 30 will apply a stress to freestanding center sections 93, and if the applied stress exceeds the material property fracture stress the disconnectable paths will break resulting in an electrical open.

Figure 16:
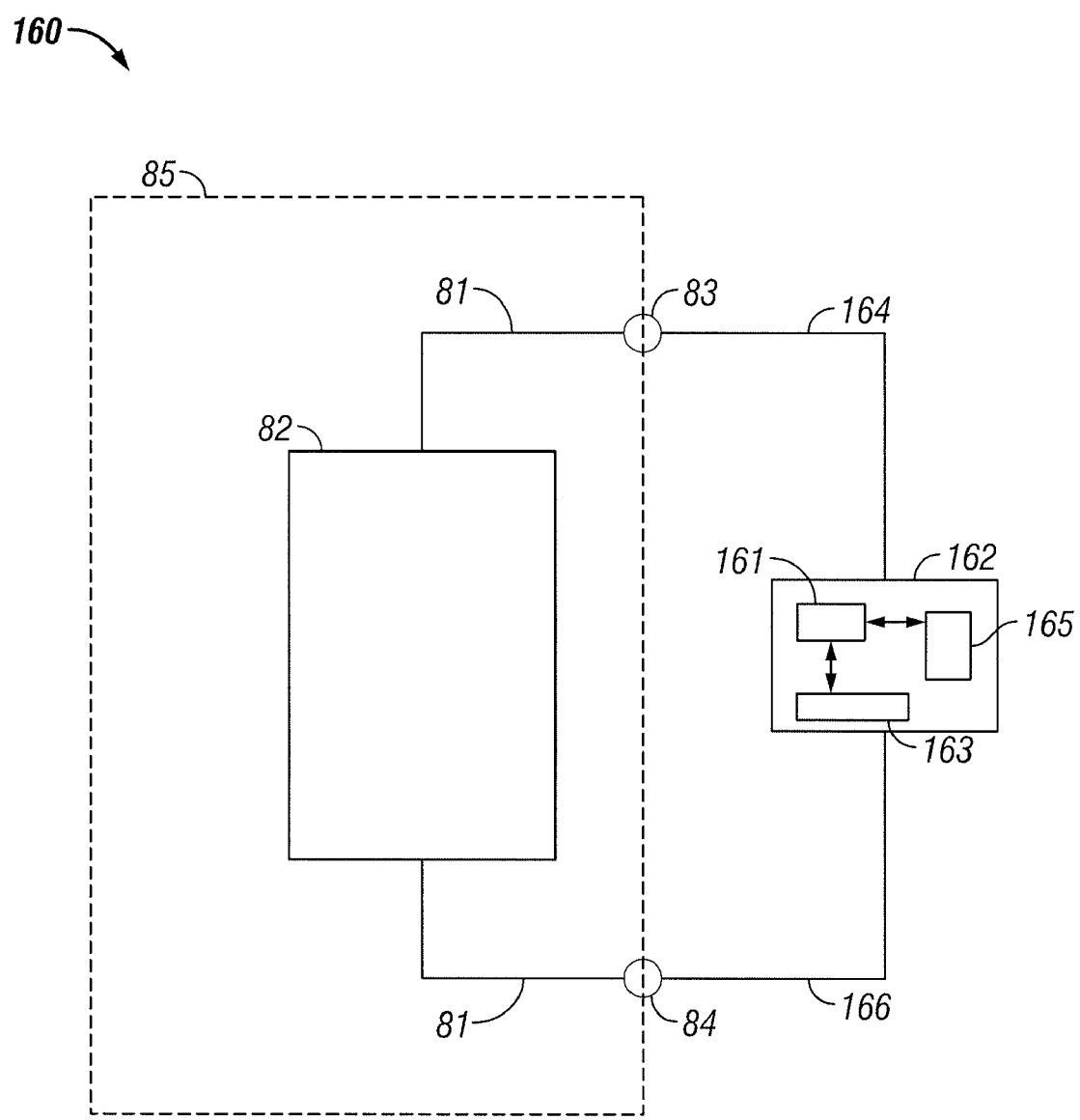
FIG. 16 is a block diagram of a system for measuring residual stress.

FIG. 16 is a block diagram of a system 160 for determining residual stress in conjunction with a residual stress monitor. The system 160 includes an RSM 85, for example, one of the embodiments of an RSM described herein, and a test circuit 162. The Test circuit 162 includes an interface connection 162 which connects to the first contact 83 and an interface connection 166 which connects to the second contact 84. Depending on the configuration of the RSM 85, the connection interfaces 162, 164 may include a single electrical connection (e.g., for connecting to an RSM as illustrated in FIG. 13) or multiple electrical connections (e.g., for connecting to an RSM as illustrated in FIG. 9). To determine residual stress, the test circuit 162 is connected to the RSM and senses which of the disconnectable paths are intact and which are broken, for example, by determining the resistance of the disconnectable paths. Based on its sensed reading, the test circuit 162 provides an output indicating the residual stress. The test circuit 162 can contain a processor 161 connected to memory 163. The memory 163 can include a look-up table that contains resistance values and associated residual stress levels for the different widths of the disconnectable paths contained in the RSM 85. The test circuit 162 can optionally include a temperature sensor 165 that is configured to provide a temperature value to the processor 161 to account for differences in temperature while measuring residual stress. In such cases, a look-up table in the memory 163 can include information associating a resistance reading at a particular temperature with a residual stress value. In the embodiment illustrated in FIG. 16, the test circuit is a separate circuit not disposed on a wafer with the disconnectable paths but rather connected to the disconnectable paths via first contact 183 and second contact 184 when a residual stress reading is desired. In other embodiments, the test circuit 162 is disposed on a wafer with the disconnectable paths. In some embodiments, the functionality of the test circuit 162 is included in a component that is used to control the MEMS array 30, such as processor 21 (FIG. 2).

Figure 17:
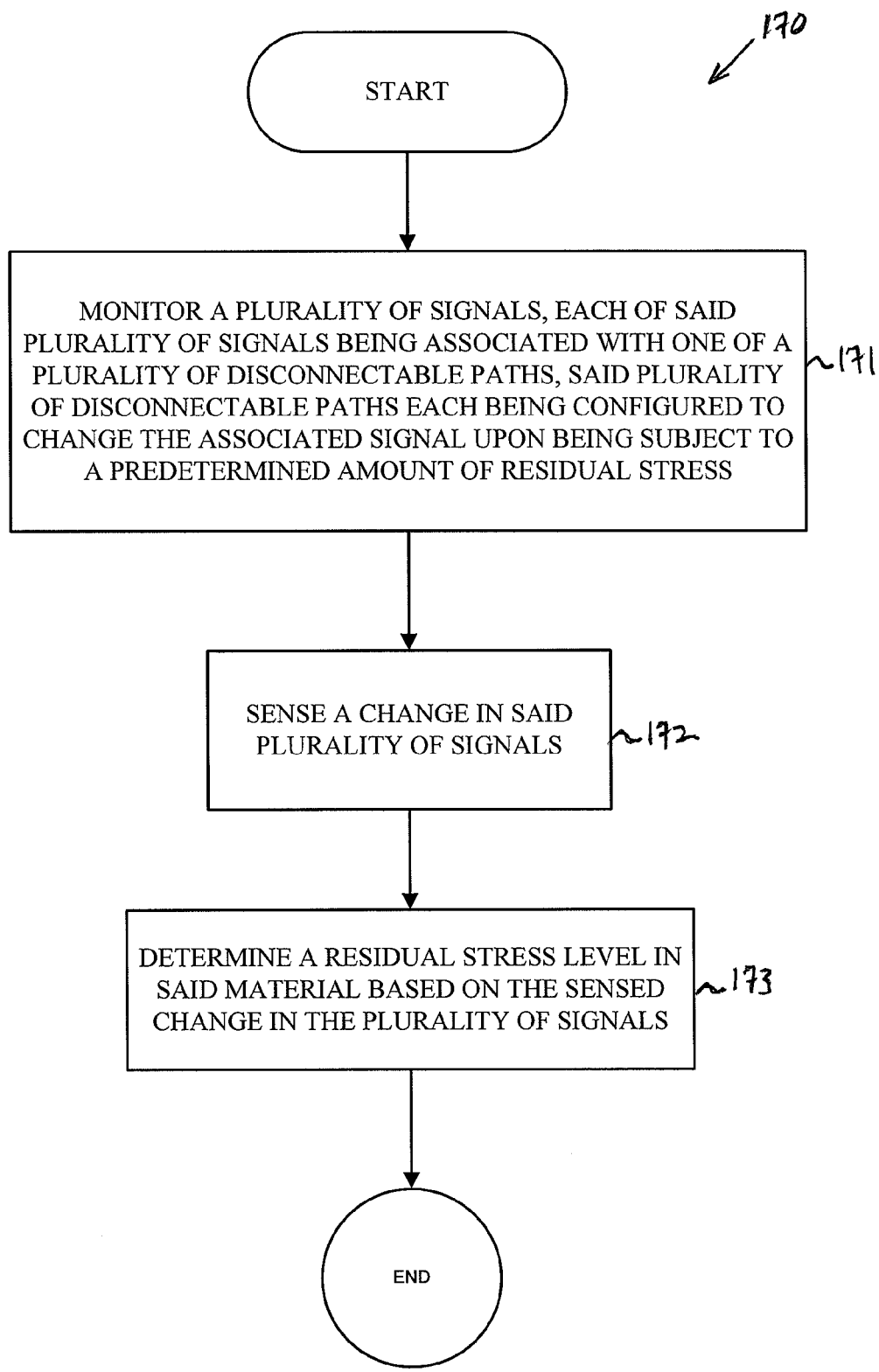
FIG. 17 is a flowchart illustrating a process of measuring residual stress.

FIG. 17 is a flowchart illustrating a process 170 for determining the residual stress of a conductive deposited material. At 171, process 170 monitors a plurality of signals that are each associated with one of a plurality of disconnectable paths. Test circuit 162 (FIG. 16) can perform such monitoring. At 172, process 170 senses a change in said plurality of signals. This step includes, for example, sensing a change in said plurality of signals from known starting values of such signals. The test circuit 162 can also perform this action, being connected to the first contact 83 and the second contact 84 when a residual stress reading is desired, and sensing a change in the resistance of the disconnectable paths from the known initial starting values. Finally, at step 173, process 170 determines a residual stress level based on the sensed change in the plurality of signals. Test circuit 162 can perform this step using, for example, a look-up table that associates a resistance value with a level of residual stress.

In any of the processes specifically described above, one or more steps may be added, or a described step deleted, without departing from at least one of the aspects of the invention. Those of ordinary skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The various illustrative logical blocks, components, modules, and circuits described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Those of ordinary skill would further appreciate that the various illustrative logical blocks, modules, and algorithm steps described in connection with the examples disclosed herein may be implemented as electronic hardware, firmware, computer software, middleware, microcode, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed methods.

The steps of a method or algorithm described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC). The ASIC may reside in a wireless modem. In the alternative, the processor and the storage medium may reside as discrete components in the wireless modem.

Various modifications to these examples may be readily apparent to those skilled in the art, and the generic principles defined herein may be applied to other examples without departing from the spirit or scope of the novel aspects described herein. Thus, the scope of the disclosure is not intended to be limited to the examples shown herein but is to be accorded the widest scope consistent with the principles and novel features disclosed herein. Accordingly, the novel aspects described herein is to be defined solely by the scope of the following claims.

The invention claimed is:

1. A device for measuring residual stress of a deposited conductive material, comprising:
    a microelectromechanical system (MEMS) including a material; and
    a plurality of disconnectable electrical paths, wherein said plurality of paths are configured to disconnect as a function of residual stress of the material.

2. The device of claim 1, wherein each of said plurality of paths is defined by a dimensional attribute which is one of a plurality of predetermined different dimensional attributes, each dimensional attribute being associated with one of a plurality of predetermined residual stress levels within a range of residual stress levels such that each of said plurality of paths disconnects when subjected to the residual stress level associated with its dimensional attribute.

3. The device of claim 2, wherein the dimensional attribute comprises width.

4. The device of claim 2, wherein the dimension attribute comprises depth.

5. The device of claim 2, wherein the dimension attribute comprises a cross-sectional area.

6. The device of claim 2, further comprising:
    a plurality of first contacts configured to interface with a sensing system, wherein each of said plurality of first contacts is connected to one of said plurality of paths at a first end of the path; and
    a plurality of second contacts configured to interface with the sensing system, wherein each of said plurality of second contacts is connected to one of said plurality of paths at a second end of the path.

7. The device of claim 2, further comprising:
    a first contact configured to interface with a sensing system, wherein said first contact is connected to a first end of all said plurality of paths; and
    a second contact configured to interface with the sensing system, wherein said second contact is connected to a second end of all of said plurality of paths.

8. The device of claim 1, further comprising:
    a display;
    a processor that is configured to communicate with said display, said processor being configured to process image data; and
    a memory device that is configured to communicate with said processor.

9. The device of claim 8, further comprising a driver circuit configured to send at least one signal to the display.

10. The device of claim 9, further comprising a controller configured to send at least a portion of the image data to the driver circuit.

11. The apparatus of claim 8, further comprising an image source module configured to send said image data to said processor.

12. The apparatus of claim 11, wherein the image source module comprises at least one of a receiver, transceiver, and transmitter.

13. The apparatus of claim 8, further comprising an input device configured to receive input data and to communicate said input data to said processor.

14. The device of claim 1, wherein said plurality of paths are configured to disconnect at different predetermined levels of residual stress over a range of residual stress.

15. The device of claim 14, wherein the range of residual stress spans a residual stress level of about 300 Mpa.

16. The device of claim 14, wherein the range of residual stress comprises at least about 225 Mpa-375 Mpa.

17. The device of claim 14, wherein the range of residual stress is centered on a selected residual stress level and includes a range of at least about 75 Mpa around said selected residual stress level.

18. The device of claim 14, wherein the range of residual stress is centered on a selected residual stress level and includes a range of at least about 25 Mpa around said selected residual stress level.

19. The device of claim 1, wherein at least five or more of said plurality of paths are configured to fracture at different predetermined amounts of residual stress over the range of residual stress.

20. The device of claim 1, wherein said plurality of paths are aligned in a first direction.

21. The device of claim 1, wherein a first portion of said plurality of paths are aligned in a first direction and a second portion of said plurality of paths are aligned in a second direction.

22. The device of claim 21, wherein the first direction and the second direction are about normal to each other.

23. The device of claim 21, wherein a third portion of said plurality of paths are aligned in a third direction.

24. The device of claim 1, wherein said material comprises Nickel.

25. A display comprising at least one device of claim 1, wherein the MEMS is an array of interferometric modulators.

26. A device, comprising:
   means for forming a MEMS device; and
   means for indicating the residual stress of said forming means.

27. The device of claim 26, wherein said forming means comprises metal.

28. The device of claim 26, wherein said stress indicating means comprises a plurality of disconnectable electrical paths, and wherein said plurality of paths are configured to disconnect as a function of residual stress of said forming means.

29. A device, comprising:
   a plurality of test structures formed from a portion of a conductive material, each test structure comprising
      a first electrical contact configured to interface with a sensing system;
      a second electrical contact configured to interface with a sensing system;
      a first base section connected to said first electrical contact;
      a second base section connected to said second electrical contact; and
      a free-standing center section connected between said first base section and said second base section, said center section having a dimensional attribute associated with a predetermined residual stress level such that said center section is configured to fracture and form an electrical disconnect between said first base section and said second base section when said center section is subject to said predetermined residual stress level,
   wherein said plurality of test structures have center sections with varying dimensional attributes that are configured to fracture when subjected to corresponding varying residual stress levels over a predetermined range of residual stress such that a residual stress level of the material is indicated by the test structure having a fractured center section with a dimensional attribute that is associated with the highest residual stress level.

30. A method of measuring residual stress of a conductive deposited material, comprising:
   monitoring a plurality of signals, each of said plurality of signals being associated with one of a plurality of disconnectable paths, said plurality of disconnectable paths each being configured to change the associated signal upon being subject to a predetermined amount of residual stress;
   sensing a change in said plurality of signals; and
   determining a residual stress level in said material based on the sensed change in the plurality of signals.

31. The method of claim 30, wherein each of said plurality of paths is defined by a dimensional attribute which is one of a plurality of predetermined different dimensional attributes, each dimensional attribute being associated with one of a plurality of predetermined residual stress levels within a range of residual stress levels such that each of said plurality of paths disconnects when subjected to the residual stress level associated with its dimensional attribute.

32. The method of claim 31, wherein the dimensional attribute comprises width.

33. The method of claim 31, wherein the dimensional attribute comprises a cross-sectional area.

34. The method of claim 30, wherein said plurality of paths are configured to disconnect at different predetermined levels of residual stress over a range of residual stress.

35. The method of claim 34, wherein the range of residual stress spans a residual stress level of about 300 Mpa.

36. The method of claim 34, wherein the range of residual stress comprises at least about 225 Mpa-375 Mpa.

37. The method of claim 34, wherein the range of residual stress is centered on a selected residual stress level and includes a range of at least about 75 Mpa around said selected residual stress level.

38. The method of claim 34, wherein the range of residual stress is centered on a selected residual stress level and includes a range of at least about 25 Mpa around said selected residual stress level.

39. The method of claim 30, wherein at least five or more of said plurality of paths are configured to fracture at different predetermined amounts of residual stress over the range of residual stress.

40. The method of claim 30, wherein said plurality of paths are aligned in a first direction.

41. The method of claim 30, wherein a first portion of said plurality of paths are aligned in a first direction and a second portion of said plurality of paths are aligned in a second direction.

42. The method of claim 41, wherein the first direction and the second direction are about normal to each other.

43. A system for determining the residual stress of a conductive material, comprising:
   a device on a substrate comprising a plurality of test structures formed from a portion of said thin film, each test structure comprising
      a first electrical contact configured to interface with a sensing system;
      a second electrical contact configured to interface with a sensing system;

a first base section connected to said first electrical contact;

a second base section connected to said second electrical contact;

a free-standing center section connected between said first base section and said second base section, said center section having a dimensional attribute associated with a predetermined residual stress level such that said center section is configured to fracture and form an electrical disconnect between said first base section and said second base section when said center section is subject to said predetermined residual stress level, wherein said plurality of test structures have center sections with varying dimensional attributes that are configured to fracture when subjected to corresponding varying residual stress levels over a predetermined range of residual stress such that a residual stress level of said material is indicated by the test structure having a fractured center section with a dimensional attribute that is associated with the highest residual stress level; and a test circuit connectable to said first contact and said second contact of each of the plurality of test structures, said test circuit configured to determine if the center section portion of each test structure is in an intact state or a fractured state, and determine a residual stress level of the material based on the determined states.

44. A method of manufacturing a device to indicate the residual stress in a deposited material, the method comprising:

disposing a conductive reflective membrane on a substrate such that a plurality of substantially parallel freestanding disconnectable test structures having different widths are formed adjacent to one another;

forming from a first end of each of said plurality of test structures an electrical path connected to a first contact; and forming from a second end of said plurality of test structures an electrical path connected to a second contact, said first and second contacts allowing interface with a sensing system.

45. A microelectromechanical (MEMS) device fabricated by the method of claim 44.

* * * * *

UNITED STATES PATENT AND TRADEMARK OFFICE
CERTIFICATE OF CORRECTION

PATENT NO.        : 7,423,287 B1
APPLICATION NO.   : 11/690708
DATED             : September 9, 2008
INVENTOR(S)       : U'Ren et al.

It is certified that error appears in the above-identified patent and that said Letters Patent is hereby corrected as shown below:

Column 2, line 43, please delete "he" and insert therefore, --the--.

Column 5, line 61, please delete "arc" and insert therefore, --are--.

Column 14, line 40, please delete "$Y_{max,i}$" and insert therefore, --$\sigma_{max,i}$--.

Column 14, line 42, please delete "$\sigma_{max,i.}$" and insert therefore, --$\sigma_{max,i}$--.

Column 14, line 47, please delete "$\sigma_{max,i.}$" and insert therefore, --$\sigma_{max,i}$--.

Signed and Sealed this

Twenty-fourth Day of March, 2009

JOHN DOLL
*Acting Director of the United States Patent and Trademark Office*